(12) United States Patent
Joisha

(10) Patent No.: US 8,819,376 B2
(45) Date of Patent: Aug. 26, 2014

(54) MERGING ARRAYS USING SHIFTABLE MEMORY

(75) Inventor: Pramod G Joisha, Cupertino, CA (US)

(73) Assignee: Hewlett-Packard Development Company, L. P., Houston, TX (US)

(*) Notice: Subject to any disclaimer, the term of this patent is extended or adjusted under 35 U.S.C. 154(b) by 325 days.

(21) Appl. No.: 13/453,982

(22) Filed: Apr. 23, 2012

(65) Prior Publication Data

US 2013/0282974 A1    Oct. 24, 2013

(51) Int. Cl.
*G06F 12/00*    (2006.01)
*G06F 9/30*    (2006.01)

(52) U.S. Cl.
CPC .................................. *G06F 9/30032* (2013.01)
USPC ........................................................ 711/165

(58) Field of Classification Search
None
See application file for complete search history.

(56) References Cited

U.S. PATENT DOCUMENTS

| | | | |
|---|---|---|---|
| 3,670,313 A | 6/1972 | Beausoleil et al. | |
| 3,708,690 A | 1/1973 | Paivinen | |
| 3,760,382 A | 9/1973 | Itoh | |
| 3,797,992 A | 3/1974 | Brown | |
| 3,893,088 A | 7/1975 | Bell | |
| 4,037,205 A | 7/1977 | Edelberg et al. | |
| 4,133,043 A | 1/1979 | Hiroshima et al. | |
| 4,322,635 A | 3/1982 | Redwine | |
| 4,845,670 A | 7/1989 | Nishimoto et al. | |
| 5,153,846 A | 10/1992 | Rao | |
| 5,504,919 A | 4/1996 | Lee et al. | |
| 5,677,864 A * | 10/1997 | Chung | 365/63 |
| 5,930,323 A | 7/1999 | Tang et al. | |
| 6,061,417 A | 5/2000 | Kelem | |
| 6,362,660 B1 | 3/2002 | Deng | |
| 6,745,216 B1 | 6/2004 | Nakamura | |
| 6,834,005 B1 | 12/2004 | Parkin | |
| 7,051,153 B1 | 5/2006 | Lin et al. | |
| 7,508,701 B1 | 3/2009 | Liang et al. | |
| 8,001,134 B2 | 8/2011 | Liu | |

FOREIGN PATENT DOCUMENTS

| | | |
|---|---|---|
| EP | 0827156 A2 | 4/1998 |
| GB | 2284079 A | 5/1995 |
| JP | 5066921 | 9/1993 |

OTHER PUBLICATIONS

Akra, M. et al., "On the Solution of Linear Recurrence Equations," Computational Optimization and Applications, 10, 2 (May 1998), pp. 195-210.

Symvonis, A., "Optimal Stable Merging," In Proc. International Conference on Computing and Information (May 1994), pp. 124-143.

Carlsson, S., "Splitmerge—A Fast Stable Merging Algorithm," Information Processing Letters, 22, 4 (Apr. 1986), pp. 189-192.

Chen, J.-C., "Optimizing Stable In-Place Merging," Theoretical Computer Science, 302, 1-3 (Jun. 2003), pp. 191-210.

Chen, J.-C. A, "Simple Algorithm for In-Place Merging," Information Processing Letters, 98, 1 (Apr. 2006), pp. 34-40.

(Continued)

*Primary Examiner* — Brian Peugh

(57) ABSTRACT

A shiftable memory that supports array merging employs built-in shifting capability to produce a merged array from a first array of data and a second array of data. The shiftable memory includes a memory to store data. The memory provides the built-in shifting capability to shift a contiguous subset of the data from a first location to a second location within the memory. The shiftable memory further includes an array-merging operator to produce the merged array using the built-in shifting capability. The contiguous subset of the data includes the first array.

15 Claims, 7 Drawing Sheets

(56) References Cited

OTHER PUBLICATIONS

Salowe, J. et al., "Simplified Stable Merging Tasks," Journal of Algorithms, 8, 4 (Dec. 1987), pp. 557-571.
Dudzinski, K. et al., "On a Stable Minimum Storage Merging Algorithm," Information Processing Letters, 12, 1 (Feb. 1981), pp. 5-8.
Geffert, V. et al., "Multiway In-Place Merging," Theoretical Computer Science, 411, 16-18 (Mar. 2010), pp. 1793-1808.
Geffert, V. et al., "Asymptotically Efficient In-Place Merging," Theoretical Computer Science, 237, 1-2 (Apr. 2000), pp. 159-181.
Horvath, E. C., "Stable Sorting in Asymptotically Optimal Time and Extra Space," Journal of the ACM, 25, 2 (Apr. 1978), pp. 177-199.
Huang, B.-C. et al., "Practical In-Place Merging," Communications of the ACM, 31, 3 (Mar. 1988), pp. 348-352.
Huang, B.-C. et al., "Fast Stable Merging and Sorting in Constant Extra Space," The Computer Journal, 35, 6 (Dec. 1992), pp. 643-650.
Hwang, F. K. et al., "A Simple Algorithm for Merging Two Disjoint Linearly Ordered Sets," SIAM Journal on Computing, 1, 1 (Mar. 1972), pp. 31-39.
Kim, P.-S. et al., "On Optimal and Efficient In Place Merging," In Proc. International Conference on Current Trends in Theory and Practice of Computer Science (Jan. 2006), pp. 350-359.
Mannila, H. et al., "A Simple Linear-Time Algorithm for In Situ Merging," Information Processing Letters, 18, 4 (May 1984), pp. 203-208.
Pardo, L. T., "Stable Sorting and Merging with Optimal Space and Time Bounds," SIAM Journal on Computing, 6, 2 (Jun. 1977), pp. 351-372.
Preparata, F. P., "A Fast Stable Sorting Algorithm with Absolutely Minimum Storage," Theoretical Computer Science, 1 (1975), pp. 185-190.
Chen-Yi Lee et al., "High-Speed Median Filter Designs Using Shiftable Content-Addressable Memory," IEEE Trans. Circuits and Systems for Video Tech., vol. 4, No. 6, Dec. 1994, pp. 544-549.
Roberto Perez-Andrade et al., "A Versatile Linear Insertion Sorter Based on a FIFO Scheme," IEEE Computer Society Annual Symposium on VLSI, 2008, pp. 357-362.
Hossain, N. et al., "An Efficient Merge Sort Technique that Reduces both Times and Comparisons," Proc. Information and Communication Tech: From Theory to Applications, Apr. 2004, pp. 537-538.
Symvonis, A., Optimal Stable Merging, (Research Paper), The Computer Journal, 1995, vol. 38, No. 8., pp. 681-690.

\* cited by examiner

| 00 | 01001000 |
| 01 | 01111000 |
| 02 | 11001000 |
| 03 | 01001110 |
| 04 | 11001010 |
| 05 | 01001010 |
| 06 | 11111011 |
| 07 | 00000001 |
| 08 | 11011011 |
| 09 | 01101111 |
| 10 | 11101011 |
| 11 | 01111010 |

| 00 | 01001000 |
| 01 | 01111000 |
| 02 | 11001000 |
| 03 | 01001110 |
| 04 | X |
| 05 | 11001010 |
| 06 | 01001010 |
| 07 | 11111011 |
| 08 | 00000001 |
| 09 | 11011011 |
| 10 | 11101011 |
| 11 | 01111010 |

*FIG. 1A*

| 00 | abc |
| 01 | def |
| 02 | ghi |
| 03 | jkl |
| 04 | mno |
| 05 | pqr |
| 06 | stu |
| 07 | vwx |
| 08 | yza |
| 09 | bcd |
| 10 | efg |
| 11 | hij |

| 00 | abc |
| 01 | def |
| 02 | jkl |
| 03 | mno |
| 04 | pqr |
| 05 | stu |
| 06 | X |
| 07 | vwx |
| 08 | yza |
| 09 | bcd |
| 10 | efg |
| 11 | hij |

*FIG. 1B*

MERGING ARRAYS USING SHIFTABLE MEMORY

CROSS-REFERENCE TO RELATED APPLICATIONS

N/A

STATEMENT REGARDING FEDERALLY SPONSORED RESEARCH OR DEVELOPMENT

N/A

BACKGROUND

Modern computers and related processing systems typically include a processor and some form of memory. The processor is generally responsible for performing the various computational tasks of the computer while the memory stores data that is used in and generated by the computational tasks. The architectural division of processing by the processor and data storage by the memory has proven successful for nearly the entire history of such systems.

For example, a typical general-purpose computer usually includes a central processing unit (CPU) and a main memory that communicate with one another over one or more communication channels (e.g., data, command and address buses). Typically, the CPU provides facilities to perform various arithmetic and logical operations, to sequence operations, and to otherwise control aspects of the general-purpose computer. For example, virtually all CPUs provide functions or operations for reading data from memory, writing data to memory and executing programs comprising a set of instructions that utilizes the data to perform a predefined task. In addition, CPUs may handle input/output (I/O) allowing communication with peripherals as well as subsystems outside of the general-purpose computer. CPUs may even provide graphics processing to handle generating and updating a graphical display unit (e.g., a monitor), in some examples.

In contrast, the main memory of modern computers, which can include one or more of static random access memory (SRAM), dynamic random access memory (DRAM), read-only memory (ROM), programmable ROM (PROM), flash memory and a variety of other memory types, typically provides a relatively narrow set of capabilities. Principal among these capabilities is storing computer programs and data that are executed and used by the CPU. Among other limited capabilities that may be found in or that are often associated with the main memory of modern computers are certain memory management functions. For example, DRAM subsystems of main memory may possess circuitry for automatic refresh of data stored therein.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which:

FIG. 1A illustrates an example of a downshift of a contiguous subset of data stored in a linear array within a shiftable memory, according to an example consistent with the principles described herein.

FIG. 1B illustrates an example of an upshift of a contiguous subset of data stored in a linear array within a shiftable memory, according to an example consistent with the principles described herein.

Figures 2, 3:
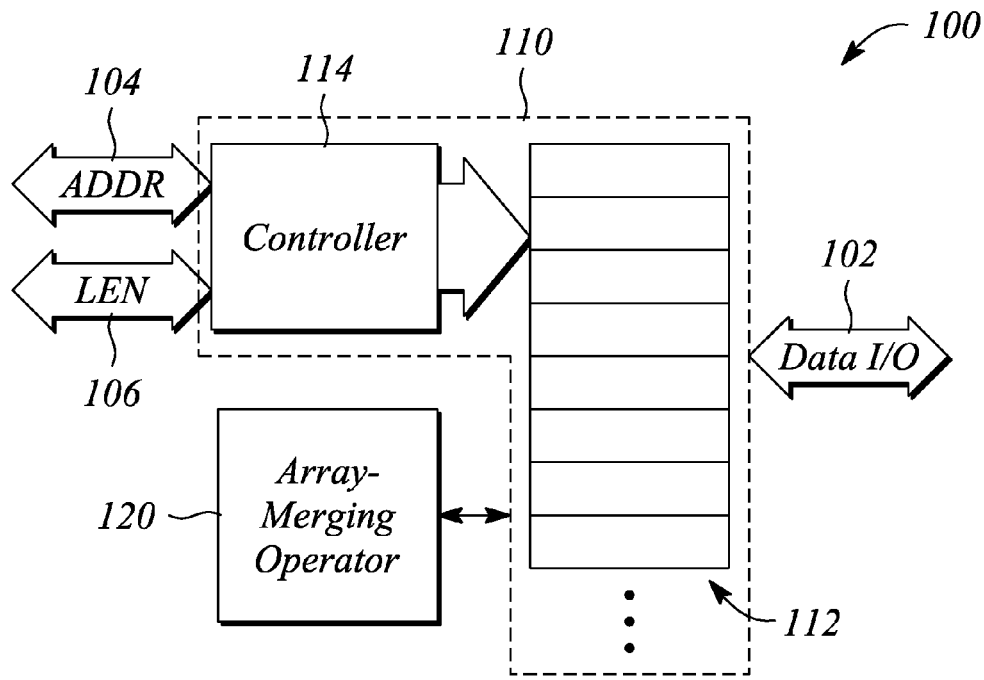
FIG. 2 illustrates a block diagram of a shiftable memory supporting array merging, according to an example consistent with the principles described herein.
FIG. 3 illustrates a portion of a truth table of an augmented decoder, according to an example consistent with the principles described herein.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein employ a shiftable memory to merge arrays of data. In particular, the shiftable memory provides data shifting capability that is substantially built into the memory, according to various examples of the principles described herein. The built-in data shifting capability facilitates a translation or a shift of a contiguous subset of data stored in the memory. According to various examples, the shift may be employed to merge an array with another array. In some examples, the arrays that are merged are adjacent to one another and the built-in shifting provides in-place merging of the arrays. In some examples, the arrays that are merged are sorted arrays and the result of merging using the built-in shifting is a merged array that is also sorted. Examples in accordance with the principles described herein have application to a variety of data processing activities and systems including, but not limited to, implementing efficient sorting routines such as a mergesort.

According to various examples, the contiguous subset of stored data (e.g., data elements in an array of data) may be shifted within the memory from a first or initial memory location to a second or final location in the memory. The data retain an ordered relationship within the contiguous subset when shifted to the second location, according to some examples. Moreover, the shift takes place entirely within the memory and the shift is generally accomplished without using resources, such as a processor, that are outside of the memory. Further, the shift does not involve data being moved between a processor and the memory, according to various examples. As a result, the memory with built-in shifting capability is referred to as 'shiftable memory' herein.

In some examples, the shift provided by the shiftable memory herein may be employed to 'open' a location in memory to facilitate insertion of data. In particular, during a merge operation, a memory location either above or below the contiguous subset of data may be rendered available for data insertion when the contiguous subset of stored data is moved by the shift within the shiftable memory. Then data may be added or inserted into the opening as a further part of the merge operation, for example. For example, the inserted data may be from another array that is being merged with an array comprising the contiguous subset of data.

According to other examples, the shift may be used to delete or 'overwrite' data stored one of above a beginning of the contiguous subset and below an end of the contiguous subset. In particular, during a merge operation the data stored above or below the contiguous subset may be overwritten with a portion of the contiguous subset itself, when the contiguous subset of stored data is shifted by the shiftable memory. For example, if the contiguous subset of stored data is part of a larger data structure (e.g., an array of data) in the shiftable memory, the shift may have the effect of deleting a portion of the data (e.g., one or more data words) in the larger data structure as part of the merge operation.

According to some examples, shifting data to either insert data or delete data in the shiftable memory may be accomplished in less time, and in some examples in considerably less time, than is generally possible without using shiftable memory. In contrast, conventional memory that relies on a processor, for example, to perform a shift generally requires an amount of time that is proportional to an amount of data being shifted. For example, shifting data in conventional memory typically involves the processor reading the data to be shifted and then writing the data back to memory in another location. Reading and writing may be performed by the processor on a word-by-word basis due to the structure and functionality of conventional memory, for example. Since each element (e.g., data word) in the data being shifted is first read from the conventional memory by the processor and then subsequently written back to the conventional memory, the time to shift the data is generally proportional to the amount or length of the data (e.g., number of data elements) being shifted, for example. The larger the amount of data, the longer the shift operation will take.

Moreover, conventional memory relies on a resource (e.g., the processor) that is external to the conventional memory to perform the reading and writing when shifting the data. Since the resource performing the shift is external to the conventional memory, each of the data elements involved in the element-by-element shift must pass between the external resource and the conventional memory through some form of data bus or similar communication channel. The data bus or similar communication channel may substantially limit a speed of the read and write operations and as a result, an overall speed of the shift. Hence, shifting large subsets of data can become prohibitively expensive in terms of the processing time due to one or both of the effects of data bus speed and the proportional time aspects of performing a shift using conventional memory.

In accordance with the principles described herein, shiftable memory has built-in shifting capability so that data is not read and then written by an external resource to perform a shift, for example. The contiguous subset of stored data is identified to the shiftable memory (e.g., using an address and a length) and the shiftable memory is instructed to shift the contiguous subset. The shift is then accomplished by and takes place entirely within the shiftable memory. Speed limitations associated with transferring data to and from an external resource are substantially eliminated by the shiftable memory, according to examples of the principles described herein. Moreover, time for shifting may be substantially independent of the length of the contiguous subset, for example.

According to various examples, shifting within the shiftable memory may be implemented with circuitry of the shiftable memory itself. As such, shifting using shiftable memory does not require sequentially reading and writing each data element of the contiguous subset. For example, shifting using shiftable memory may shift all of the data in the contiguous subset in a substantially simultaneous manner. As such, the shiftable memory may implement shifting of the contiguous subset in a time that is substantially independent of the length of the contiguous subset.

In some examples, the shiftable memory may perform the shift in substantially constant time, according to the principles described. By 'constant time' it is meant that a substantially similar amount of time is required to shift the contiguous subset of stored data regardless of the length of the contiguous subset. For example, an arbitrary length contiguous subset may be shifted in a single clock cycle, according to some examples. In another example, a shorter contiguous subset may need only a single clock cycle while a longer contiguous subset may require two or more clock cycles. However, while the shiftable memory may use more time for longer subsets than relatively shorter subsets, the shift is still performed in substantially constant time since the time required is not strictly proportional to the contiguous subset length.

Herein, the term 'memory' refers to any sort of memory that can receive and store data. The memory is generally consistent with memory that may be employed by a computer processor or in a computer system, for example. In particular, by definition herein, memory refers to any sort of memory that can be written to and read from during operation of the computer that employs the memory. For example, the memory may comprise random access memory (RAM). The random access memory may be static RAM (SRAM), for example. Other types of memory include, but are not limited to, dynamic random access memory (DRAM), flash and similar non-volatile memories that are writable during operation of the computer, various forms of optical memory (e.g., re-writable optical discs), magnetic memory (e.g., computer hard drives) and various memory structures based on latches, flip-flops and other bi-stable constructs.

Also herein by definition, a memory may comprise a plurality of groups of memory cells. A plurality of memory cells may be also be arranged as an array, according to some examples. For example, the memory cells may be arranged as a linear array. In another example, the memory cells are arranged in a two dimensional (2-D) array. Higher order (e.g., three or more dimensions) arrays also may be employed. In some examples, a lower order array (e.g., a linear array) is defined on an array with a larger dimension (e.g., 2-D array). For example, a linear array may be defined by an addressing arrangement on a rectangular 2-D array of memory cells. In addition, arrays may be divided into subarrays. For example, a 2-D array may be divided into quadrants as four subarrays. According to various examples, the array may be either a physical array or a logical array. A physical array comprises memory cells that are physically organized or located relative to one another according to or as defined by the array. A logical array comprises a logical arrangement of the memory cells as an array. In a logical array, a physical arrangement of the memory cells may differ from the logical arrangement defined by the array, for example. Logical arrays may be defined using address indirection, for example.

A 'memory cell' is a circuit or a related construct that holds or stores data, as defined and employed herein. Further, by definition herein, memory cells may store one or more 'bits' of data. For example, the bit may be a binary value (e.g., '0' or '1') and the memory cell may hold a single bit. In another example, the memory cell may hold a plurality of binary value bits. In particular, the memory cell may hold or store a complete data element (e.g., data word) comprising the plurality of bits, as defined herein. For example, a memory cell may hold 4, 8, 16, 32 or 64 binary bits. In yet another example, the memory cell may hold data in another form (e.g., a hexadecimal value, an analog value, etc.). In particular, memory cells, as defined herein, are not restricted to storing data in a binary format but in some examples, may hold or store an arbitrary data construct. However, for discussion purposes herein, binary data is generally employed throughout by way of example and not by way of limitation, unless otherwise stipulated.

Memory cells are also often referred to as 'memory locations' herein. Strictly speaking, a memory location is a memory cell(s) at a particular location within the memory, the location being designated or identified by an address. The memory cell is accessed using the address, for example. However, for simplicity of discussion herein, memory cells are generally referred to as having or being at an address. Addresses or locations may be associated with a shiftable unit (e.g., a data element) of the memory, for example. As such, 'location' and 'address' may be employed interchangeably herein. In addition, 'location' may be used to refer to a location of a contiguous set of data that is designated by a starting address and an ending address, according to some examples. In other examples, the location of the contiguous set may be designated by a starting (or an ending) address and a length of the contiguous set.

Adjacent memory cells as defined by adjacent memory locations may be physically adjacent (i.e., located next to one another) or logically adjacent, by definition herein. Logical adjacency may be established by an overlying logical memory structure (e.g., using indirection), according to some examples. For example, logically adjacent memory cells may be physically separated from one another but still be considered adjacent in terms of an overlying memory structure that employs interleaving. Likewise, the contiguous subset may be physically contiguous (i.e., located in physically adjacent memory cells) or logically contiguous. In particular, the contiguous subset of data as stored in the adjacent memory cells of the shiftable memory acquires a contiguity that is analogous to and dictated by the adjacency of the memory cells, by definition herein.

Further herein and as noted above, a 'shift' as performed by the shiftable memory is defined as a translation of a contiguous subset of data stored within the memory, unless otherwise stipulated. In particular, by definition herein, a shift using the shiftable memory constitutes the translation (e.g., up or down an array) of the stored data (e.g., data elements) within the contiguous subset from a first location to a second location within the memory. Furthermore, the shift, when applied to the contiguous subset of stored data, translates all of the stored data within the contiguous subset. Moreover, the shift by the shiftable memory does not result in a translation or shift of data outside of the subset of data involved in the shift, by definition herein. In general, the shift may move the data by a distance of one or more memory locations or memory addresses. For example, the shift may move the data a single memory location up or down within the memory.

Herein, shift directions 'left' and 'up' are defined with respect to memory locations within the shiftable memory as a shift direction toward locations having smaller addresses. The shift directions 'right' and 'down' are defined as a direction toward locations having larger addresses. Hence, an 'upshift' or a 'left-shift' is defined as shifting the data to a second location having a smaller address than an address of a first or starting location. Conversely, a 'downshift' or a 'right-shift' results in moving the data from a first location having a smaller address to a second location with a larger address. However, while the shift direction is controllable or selectable according to some examples, the shift direction (e.g., left, right, up or down) may be completely arbitrary with respect to the physical address space, as employed herein. Further, the specific use of 'left-shift', 'right-shift', 'upshift' and 'downshift' herein is for discussion purposes and is not a limitation.

FIG. 1A illustrates an example of a downshift of a contiguous subset of data stored in a linear array within a shiftable memory, according to an example consistent with the principles described herein. In particular, FIG. 1A illustrates a plurality of memory cells, each of which is capable of storing a data element. For example, the data elements may comprise eight binary bits, each bit (e.g., either a '1' or '0') being stored in a separate one of eight memory cells. Further as illustrated, each of the illustrated memory cells is identified by an address ranging from 00 to 11. A left side of FIG. 1A illustrates the plurality of memory cells before the downshift while a right side illustrates the same plurality of memory cells after the downshift. Note that the downshift illustrated in FIG. 1A may be viewed equivalently as a right-shift by rotating the illustrated linear array by ninety degrees counterclockwise.

As illustrated, the example downshift within the shiftable memory comprises selecting a contiguous subset of stored data elements, for example starting with a memory cell at address 04 and ending with a memory cell at address 08. The selected contiguous subset contains data elements {11001010, 01001010, 11111011, 00000001, 11011011} in the illustrated example. The shiftable memory then downshifts the selected contiguous subset of data elements by moving the stored data elements down one address location, for example, as illustrated in the right side of FIG. 1A. The downshift maintains an order of the data elements within the contiguous subset and deposits the contiguous subset in memory cells between address 05 and address 09. Downshifting the stored data overwrites the contents of a memory cell immediately below the contiguous subset (i.e., at address 09) and replaces the contents of that memory cell with a last data element (i.e., '11011011') of the downshifted contiguous subset.

Further, the memory cell at address 04 which originally held the first data value of the contiguous subset is rendered indeterminate as indicated by the 'X', as illustrated in FIG. 1A, by way of example. In some examples, the memory cell at address 04 may retain a copy of the data element (e.g., '11001010') that was present before the downshift or may be cleared (e.g., set to '00000000') after the downshift. In other examples, the memory cell at address 04 may be available for insertion of a data element from an external source, for example. A data element may be inserted into the memory cell at address 04 by sequentially presenting and clocking individual bits of the inserted data element into the memory cell at address 04 (e.g., a serial write), according to some examples.

FIG. 1B illustrates an example of an upshift of a contiguous subset of data stored in a linear array within a shiftable memory, according to an example consistent with the principles described herein. In particular, FIG. 1B illustrates a plurality of memory cells each of which stores a data element (e.g., 'abc,' 'def,' etc.). Further as illustrated, each of the illustrated memory cells is identified by an address ranging from 00 to 11. A left side of FIG. 1B illustrates the plurality of memory cells before the upshift while a right side illustrates the same plurality of memory cells after the upshift. Note that the upshift illustrated in FIG. 1B may be viewed equivalently as a left-shift by rotating the illustrated linear array by ninety degrees counterclockwise.

As illustrated in FIG. 1B, the upshift in shiftable memory comprises selecting a contiguous subset of stored data elements, for example starting with a memory cell at address 03 and ending with a memory cell at address 06. The shiftable memory then upshifts the selected contiguous subset by moving the stored data elements in the selected contiguous subset up one address location, for example, as illustrated in the right side of FIG. 1B. The upshift maintains an order of the words within the contiguous subset and deposits the contiguous subset in memory cells between address 02 and address 05. Upshifting the stored data elements overwrites the contents of a memory cell immediately above the contiguous subset (i.e., at address 02) replacing the contents of that memory cell with a first word (i.e., 'jkl') of the upshifted contiguous subset. Further, the memory cell at address 06 which originally held the last word of the contiguous subset is rendered indeterminate as indicated by the 'X'. According to some examples, the memory cell at address 06 may retain a copy of the data element (e.g., 'stu') that was present before the upshift or may be cleared (e.g., set to '000') after the upshift, or the memory cell at address 06 may be available for insertion of data from an external source, for example.

According to some examples, the shiftable memory may be a portion of a main memory of a general-purpose computer system. For example, the shiftable memory may represent a subset of the memory that makes up the main memory. Furthermore according to various examples, the shiftable memory is distinct from memory cells, cache and other relatively small memory structures often found integrated together with other components (e.g., an arithmetic logic unit, controller, etc.) in a microprocessor, for example. For example, shiftable memory may include many megabytes or more (gigabytes, terabytes, etc.) of storage whereas processor memory typically may be limited to less than a few tens of bytes (e.g., processor registers) to a few megabytes (e.g., L1 cache, L2 cache, etc.), for example. According to some examples, the shiftable memory may be a specialized partition of the main memory or a subsystem thereof.

Further with respect to the principles described herein, a 'rotational shift' is a shift that also transfers or moves a last data element of a shifted contiguous subset to a beginning of the contiguous subset. The transfer may be by means of a physical connection between an end of the contiguous subset and the beginning of the contiguous subset, for example. In a rotational shift, data elements beyond the end of the contiguous subset may not be deleted or overwritten, according to various examples. In particular, since the last data element is moved to the beginning of the contiguous subset in a rotational shift, the last data element is not shifted into a memory location outside the shifted contiguous subset, for example. As a result, no data is overwritten in the rotational shift, according to some examples.

Moreover, a 'sorted array' is defined herein as an array in which data in the array is sorted according to some value or another criteria, either actual or assigned. For example, the data may be sorted according to a numerical value of various data elements stored in the array. An example array of numerical values such as [1, 3, 4, 5, 7, 10] is a sorted array, for example. In another example such as when the array stores text, the data may be sorted alphabetically. In yet other examples, a sorting criteria may be arbitrarily assigned to data elements in an array to facilitate sorting of the data elements. For example, an arbitrary sorting criteria such as relative wavelength be used when sorting of an array representing a list of selected colors. Sorting data representing files in a computer system may be based on a date the files were created (a creation date) or based on a date the files were modified (a modification date), for example. According to various examples, the data in a sorted array may be sorted in either a non-decreasing (e.g., ascending) manner or a non-increasing (e.g., descending) manner.

In some examples herein, an array may be stored completely within the shiftable memory. In other examples, an array may comprise data that is stored one or both of inside and outside of the shiftable memory, by definition herein. For example, the array may encompass or span both conventional memory and the shiftable memory. In some examples, a particular array may be substantially located in conventional, non-shiftable memory with portions of the data stored in the array being moved (e.g., moved temporarily by copying) into the shiftable memory. For example, the data may be moved for the purposes of shifting the contiguous subset of data. After shifting, data comprising some or all of the shifted contiguous subset of data may be moved from the shiftable memory back into conventional memory, for example.

Further, as used herein, the article 'a' is intended to have its ordinary meaning in the patent arts, namely 'one or more'. For example, 'a memory cell' means one or more memory cells and as such, 'the memory cell' means 'the memory cell(s)' herein. Also, any reference herein to 'top', 'bottom', 'upper', 'lower', 'up', 'down', 'front', back', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Moreover, examples herein are intended to be illustrative only and are presented for discussion purposes and not by way of limitation.

FIG. 2 illustrates a block diagram of a shiftable memory 100 supporting array merging, according to an example consistent with the principles described herein. The shiftable memory 100 is configured to provide moving or shifting of a contiguous subset of data in the shiftable memory 100. The data may be in the form of data elements, for example. The data elements may each comprise one or more data values, for example. Shifting of data (e.g., data words) by the shiftable memory 100 shifts only the data in the contiguous subset and not other data outside of the contiguous subset. In particular, when the shiftable memory 100 performs a shift of the contiguous subset, only data of the contiguous subset is shifted, according to various examples. The shift does not shift other data located outside of the contiguous subset, for example. Further, the shift moves the contiguous subset of data without substantially changing or otherwise affecting an order of the data in the contiguous subset, according to some examples.

In some examples, an external resource (e.g., a processor) communicates data to and from the shiftable memory 100 via a data bus (Data I/O) 102. For example, data to be stored in the shiftable memory 100 may be communicated from the external resource to the shiftable memory 100 via the data bus 102. Similarly, data that is stored in and subsequently read from the shiftable memory 100 may be communicated to the external resource from the shiftable memory 100 via the data bus 102, for example. Moreover, information used to control an operation of the shiftable memory 100 such as, but not limited to, an address and a length of the contiguous subset, may be communicated to the shiftable memory 100 using an address bus (ADDR) 104 and a length bus (LEN) 106, according to some examples. A single address bus that carries both the address and the length or alternatively, a pair of addresses, may be employed in other examples (not illustrated).

As illustrated, the shiftable memory 100 supporting array merging comprises a memory 110 to store data. As mentioned above, the data may be stored as data elements, according to some examples. The memory 110 has or provides built-in shifting capability to shift a contiguous subset of the data from a first location to a second location within the memory 110. In particular, the built-in shifting capability is configured to shift the contiguous subset of data (e.g., data elements) substantially within the memory 110. During the shift, the data are not transferred out of the memory 110 to accomplish the shift, according to various examples. For example, the second location may represent a shift of the data relative to the first location of a single unit of data (e.g., a data element). The shift may be accomplished by moving data along pathways within the memory 110 from the first location to an adjacent location of the memory 110 representing the second location, for example.

Moving data to the adjacent location is referred to as an 'adjacent-location transfer' herein. In another example, the shift may move the contiguous subset of data by more than one data unit (e.g., two or more data elements). A shift of two or more data units may be accomplished by a direct shift using internal data pathways of the memory 110 from the first location to the second location that is two or more data units distant from the first location, for example. In other examples, the memory 110 having built-in shifting capability may move the data in a series of smaller steps (e.g., a plurality of adjacent-location transfers) to achieve the shift of more than one data unit. However, in each example, the built-in shifting capability of the memory 110 accomplishes the shift substantially without relying on or employing a transfer of the data in and out of the memory 110, according to various examples of the principles described herein.

According to some examples, the memory 110 comprises a plurality of memory cells 112 configured as an aggregate to store data (e.g., as one or more data elements). In some examples, the memory cells 112 are configured to store binary data. In some examples, each memory cell 112 is configured to store a single bit of binary data (e.g., as a '1' or '0'). In other examples, each memory cell 112 is configured to store a plurality of binary data bits. For example, each memory cell 112 may store a data value as a plurality of binary data bits. In particular, according to some examples, each memory cell 112 comprises a plurality of memory locations configured as an aggregate to store data bits corresponding to the data value. The plurality of data bits of the data value defines a width of the memory cell 112. In other examples, the memory cell 112 may store the data in a form other than as one or more binary bits.

According to various examples, the memory 110 may be implemented using substantially any memory technology. For example, memory cells 112 of the memory 110 may be implemented using static random access memory (SRAM). In another example, one or more flip-flops such as, but not limited to, a D flip-flop, may be employed to implement the memory cells 112 of the memory 110. In other examples, yet another memory technology (e.g., DRAM, memristors, etc.) may be used to implement the memory cells 112 of the memory 110.

According to some examples, the memory 110 further comprises a controller 114. The controller 114 is configured to select a contiguous subset of the stored data elements. The controller 114 is further configured to control shifting of the selected contiguous subset from a first location to a second location within memory 110. The selected contiguous subset has a length that is less than a total length of the memory 110, according to various examples of the principles described herein. Using one or more control signals, the controller 114 may cause the memory 110 to shift the selected contiguous subset by instructing the memory 110 to perform the shift, for example.

In various examples, the memory 110, or more generally the shiftable memory 100, facilitates one or both of a left-shift and a right-shift of the contiguous subset of data (e.g., data elements). In particular, a memory cell 112 of the second location within the memory 110 may be located either to the left of or to the right of a corresponding memory cell 112 of the first location, depending on a direction of the shift. In some examples, the memory cell 112 of the second location is a single memory cell (or memory location) away from the corresponding memory cell 112 of the first location. In other words, the shift represents movement of the contiguous subset of stored data elements by a single memory location or address. In other examples, the second location represents a movement of more than a single memory cell 112 away from the corresponding memory cell 112 of the first location. For example, the data elements may be stored as a linear array of bits within the shiftable memory 100 and the shift may be a number of bits equal to a length of the data element in terms of bits (e.g., 8-bit shift, 16-bit shift, etc.).

In some examples, the selected contiguous subset is specified by both of an address of a first memory cell 112 of the contiguous subset and an address of a last memory cell 112 in the contiguous subset. For example, the first memory cell address and the last memory cell address are communicated to the controller 114 (e.g., via an address bus) to facilitate selecting the contiguous subset. The first memory cell address and last memory cell address may be communicated either sequentially as a first address followed by a second address over a single bus (e.g., ADDR 104), according to various examples. Alternatively, the first and last addresses may be communicated in parallel as two simultaneous addresses either over two buses or over two portions of a single, wide bus, for example.

In another example, the selected contiguous subset is specified by an address of the first memory cell 112 and a length of the contiguous subset (e.g., via ADDR 104 and LEN 106, as illustrated). In some of these examples, the length may be the length of the contiguous subset that follows the first memory cell 112 such that the last memory cell address is given by a sum of the first memory cell address and the length.

In other examples, the length includes the first memory cell 112 such that the last memory cell address is given by the first memory cell address plus the length, minus one. Other examples may specify the last memory cell address and the length of the contiguous subset that precedes the last memory cell, as well as other schemes, for example.

In some examples, the controller 114 comprises an augmented decoder (not illustrated). The augmented decoder employs information regarding the address and the length (or alternatively the first and last memory cell addresses) to select the contiguous subset of stored data. In some examples, the augmented decoder uses the information (e.g., address and length of the contiguous subset) to assert an output corresponding to each of the memory cells 112 of the selected contiguous subset within the memory 110. Asserting an output may comprise outputting a logic '1' on a connection path or wire (e.g., a word line W) between the augmented decoder and the plurality of memory cells 112, for example. As such, the augmented decoder may output a logic '1' on a plurality of word lines of the memory 110, the word lines corresponding to the memory cells 112 that contain the stored data of the selected contiguous subset. The word lines may be connected to a load enable input or a select input of the memory cells 112, for example. In other examples, asserting an output comprises outputting a logic '0'. Asserting a logic '0' may be used when the memory cells 112 have a 'not' load enable input or a 'not' select input, for example. FIG. 2 omits explicit illustration of the load enable and select enable inputs for illustration expediency.

FIG. 3 illustrates a portion of a truth table of an augmented decoder, according to an example consistent with the principles described herein. In particular, the augmented decoder corresponding to the illustrated truth table is configured to select the contiguous subset in an example memory 110 having eight memory cells 112. The truth table has three address inputs (ADDR), a length (LEN) input and eight word lines W (i.e., $W_0$-$W_7$). The eight word lines W may correspond to load enable inputs of eight memory cells 112 in the example memory 110, for example. As can be seen in the truth table, for a value of LEN equal to '00', the augmented decoder functions substantially similar to a conventional decoder (i.e., only one word line W is asserted at a time). However, a plurality of word lines W are asserted for all other values of LEN to facilitate simultaneous enabling of a corresponding plurality of memory cells 112 that hold or store the selected contiguous subset of stored data elements to be shifted.

In some examples, the augmented decoder may be implemented using a read-only memory (ROM). The ROM is programmed with a truth table that specifies the functionality of the augmented decoder. A decoder of the ROM decodes an input (e.g., ADDR and LEN) and the programmed connections within the ROM augment the output of the ROM decoder to produce the augmented decoder functionality, for example. In another example, a conventional decoder may be augmented with an output circuit other than the programmed connections to implement the augmented decoder. In yet another example, the augmented decoder may be implemented using a latched ripple cascade.

Referring again to FIG. 2, the shiftable memory 100 supporting array merging further comprises an array-merging operator 120. The array-merging operator 120 is configured to produce a merged array using the built-in shifting capability of the memory 110. According to various examples, the merged array is produced by merging a first array of data and a second array of data. As such, the merged array represents the merging of the first and second arrays. Further, the contiguous subset of data comprises the first array, according to various examples.

In some examples, one or both of the first array and the second array are sorted arrays. In some examples, the merged array is also a sorted array. In some examples, one or more of the first array, the second array and the merged array include data elements that are sorted in a non-decreasing order. In other examples, one or more of the first array, the second array and the merged array include data elements that are sorted in a non-increasing order.

In some examples, the array-merging operator 120 is configured to provide in-place merging of the first array and the second array into a single array that represents the merged array. In particular, the first array and the second array may be located adjacent to one another, in some examples. Further, the first array and the second array may be collocated with the merged array in the memory. By 'collocated' it is meant that the first array and the second array occupy a portion of the memory 110 that will hold the merged array once the merged array is produced by the array-merging operator 120. As such, the merged array substantially replaces the first array and the second array in the memory 110 when the merged array is produced by the array-merging operator 120. In these examples, the first array and the second array may be considered subarrays of a larger array that becomes the merged array once merging is complete. Further, the first and second subarrays substantially cease to exist once the merging is complete.

In other examples, the first array and the second array are not collocated with the merged array in memory 110. For example, the merged array may be produced using built-in shifting of data elements of the first array such that only the first array and the merged array are collocated in the memory 110. The second array may be located elsewhere either in the memory 110 or in another memory (e.g., non-shiftable memory), for example.

In some examples, the shiftable memory 100 supporting array merging further comprises a temporary memory register (not illustrated in FIG. 2). The temporary register may be configured to hold or temporarily store data (e.g., a data element) from the second array. For example, the data may be held by the temporary register while the memory 110 providing built-in shifting capability shifts the contiguous subset of data of the first array to open a space for insertion of the data held by the temporary register. The temporary register may be a memory location in the memory 110, for example. In other examples, the temporary register may be a memory location in another memory (e.g., non-shiftable memory) or even a register of a processor (e.g., the controller 114), for example.

In some examples, the array-merging operator 120 is implemented as one or both of software or firmware (e.g., computer code or instructions) that is stored in a computer readable media and executed by a processor. The computer readable media may include, but is not limited to, various forms of computer memory (e.g., RAM, ROM, flash memory, etc.), a magnetic disk, and an optical disk of a computer system. The software or firmware of the array-merging operator 120 may be executed by a computer processor that is part of a system employing the shiftable memory 100, for example. In particular, in some examples, the array-merging operator 120 is stored in non-transient computer readable media and the controller 114 comprises a computer processor that reads the computer readable media and executes the array-merging operator 120.

In other examples, the array-merging operator 120 is implemented in hardware. For example, the array-merging operator 120 may be implemented as a machine code instruction of a processor (e.g., a microprocessor) that employs the shiftable memory 100. In another example, the array-merging operator 120 may be one or both of implemented within and collocated with circuitry of the shiftable memory 100, itself. For example, the array-merging operator 120 may be implemented as logic circuits that are part of the controller 114. In another example, the array-merging operator 120 is implemented as an application specific integrated circuit (ASIC) that operates in conjunction with the controller 114, for example. In yet other examples, the array-merging operator 120 may be implemented as part of a memory controller (not illustrated) that supports and provides an interface to the shiftable memory 100 as part of a memory subsystem. However, while the array-merging operator 120 may be implemented remote from other portions of the shiftable memory 100, the array-merging operator 120 is considered an element of the shiftable memory 100 by virtue of being configured to operate on the contiguous subset of data elements within the memory 110, according to various examples.

According to various examples and in various implementations, the array-merging operator 120 is configured to perform, and in some instances to repeat, a plurality of operations or actions including, but not limited to, shifting the contiguous subset. For example, the array-merging operator 120 may compare a data element in the first array with a corresponding data element in the second array. The array-merging operator 120 may then shift the data of the first array to open a space at a first end of the first array using the built-in shifting capability of the memory 110, for example. According to various examples, the data of the first array may be shifted when comparing a data element in the first array indicates that the corresponding data element of the second array should be inserted into the first array. The array-merging operator 120 may then insert the corresponding data element of the second array into the open space. The array-merging operator 120 may repeat the above-described plurality of actions until the merged array is produced.

In some examples, the first array and the second array comprise data elements that are sorted and therefore, the arrays are sorted arrays. For example, one or both of the first array and the second array may be sorted in either a non-decreasing order or a non-increasing order. In some examples when the first and second arrays are sorted in a non-decreasing order, comparing a data element of the first array may indicate that the corresponding data element of the second array should be inserted in the opening at the first end of the first array. Insertion may be indicated when a value of the first array data element is greater than the corresponding data element of the second array, for example. Alternatively, in examples when the first and second arrays are sorted in a non-increasing order, comparing a data element of the first array may indicate that the corresponding data element of the second array should be inserted when a value of the first array data element is less than the corresponding data element of the second array, for example.

In some examples, the array-merging operator 120 of the shiftable memory 100 may be represented by an example function MERGE (A, p, q, r) defined in pseudocode as:

---

MERGE(A, p, q, r):
   $h_1 \leftarrow p$
   $h_2 \leftarrow q + 1$
   while ($h_1 < h_2$ and $h_2 \leq r$) do
      if (A[$h_1$] compare A[$h_2$]) then
         t ← A[$h_2$]

---

-continued

--- shiftr(A, $h_1$, $h_2 - h_1$)
         A[$h_1$] ← t
         $h_2 \leftarrow h_2 + 1$
      endif
      $h_1 \leftarrow h_1 + 1$
   endwhile

--- where shiftr(•) is a right-shift function, variable A is an array of data elements A[•], variables p, q and r are indices of the data elements A[•] of the array A, where index q is greater than or equal to index p and less than index r (i.e., $p \leq q < r$). In particular, the array A is an array defined in the shiftable memory that has a first data element A[p] at the index p and a last data element A[r] at the index r. Further, as represented in the example pseudocode above, the arrays being merged include a subarray of the array A having data elements A[•] initially spanning between the index p and the index q (a first array) and a subarray of the array A having data elements A[•] spanning from an index q+1 to the index r (a second array). Variables $h_1$ and $h_2$ in the example pseudocode above represent temporary variables that each holds an index pointing to a first data element A[•] in the first subarray and the second subarray, respectively. A variable t is a temporary variable that holds the contents of a data element A[•] of the array A. When the pseudocode terminates, the array A represents the merged array produced by the function MERGE (A[•], p, q, r).

According to various examples, the right-shift function shiftr(•) of the example pseudocode above is defined as a function shiftr(A, start, extent) that implements a right-shift of a contiguous subset of data in the array A using the built-in shifting capability of the memory 110. In particular, the function shiftr(A, start, extent) shifts a contiguous subset of data within the array A one data unit (e.g., a distance of one data element A[•]) to the right within the array A. The contiguous subset shifted by the function shiftr(A, start, extent) starts at an index start (e.g., A[start]) and ends at an index start+extent−1 (i.e., A[start+extent−1]).

In other examples, array-merging operator 120 may employ a left-shift (e.g., a left-shift function shiftl(•)) that implements a left-shift of the contiguous subset of data in the array A using the built-in shifting capability of the memory 110. For example, the MERGE(•) above may be modified to employ shiftl(•) in place of the shiftr(•). Of course, when the left-shift function shiftl(•), various ones of the variables, limits, etc. are also modified accordingly to correspond with the left-shift of the data.

Further according to various examples, the pseudocode example above comprises an operator compare of an if . . . then statement that performs a comparison of a pair of data elements A[•] to determine whether or not actions defined by the pseudocode within the if . . . then statement are to be performed. A particular meaning of the operator compare is determined by a sorted configuration or order of the first and second subarrays, according to some examples. For example, the operator compare may be replaced by a 'greater than' operator (e.g., '>') if the first and second subarrays are sorted in a non-decreasing order. Alternatively, the operator compare may be replaced by a 'less than' operator (e.g., '<') if the first and second subarrays are sorted in a non-increasing order.

Referring to the above-referenced example pseudocode, when the function MERGE(A, p, q, r) is called or executed, variables $h_1$ and $h_2$ are initially loaded with indices of the first data elements A[•] of the first subarray and the second subarray, respectively, (i.e., $h_1 \leftarrow p$ and $h_2 \leftarrow q+1$). Execution of the function MERGE(A, p, q, r) continues with a while . . . do loop that continues to execute as a loop that repeats at an endwhile statement as long as $h_1$ is less than $h_2$ and $h_2$ has not gone past the end of the array A (i.e., $h_2 \leq r$). In particular, the while . . . do loop includes an if . . . then statement terminated by an endif statement. If the compare operator of the if . . . then statement evaluates as 'true', the variable t is loaded with the contents of a first data element $A[h_2]$ of the second subarray (i.e., $t \leftarrow A[h_2]$). Then the contiguous subset of data is right-shifted by the built-in shifting capability of the memory 110 (i.e., shiftr(A, $h_1$, $h_2-h_1$) function) to open a space in the array A at index $h_1$ and the contents previously loaded in the variable t are the inserted into the open space in the array A (i.e., $A[h_1] \leftarrow t$). Additionally, the index $h_2$ is incremented (i.e., $h_2 \leftarrow h_2+1$).

In some examples when the compare operator is a 'greater than' operator (e.g., '>'), the compare operator will evaluate as 'true' and the operations within the if . . . then statement will be performed when the data element $A[h_1]$ is greater than $A[h_2]$ (i.e., when $A[h_1] > A[h_2]$). Alternatively, when the compare operator is a 'less than' operator the compare operator will evaluate as 'true' and the operations within the if . . . then statement will be performed when the data element $A[h_1]$ is less than $A[h_2]$ (i.e., when $A[h_1] < A[h_2]$), for example. If the compare operator evaluates as 'false', then the operations within the if . . . then statement are not performed. Just before an end of the while . . . do loop (e.g., just before the endwhile statement of the example pseudocode), the index $h_1$ is incremented (i.e., $h_1 \leftarrow h_1+1$).

It should noted that, since the indices $h_1$ and $h_2$ point to the first elements in respective ones of the first subarray and the second subarray, incrementing of these indices has the effect of changing an extent of each of these subarrays. Moreover, when the loop terminates, the array A contains the merged contents of the two subarrays and thus, is the merged array.

Figure 4A:
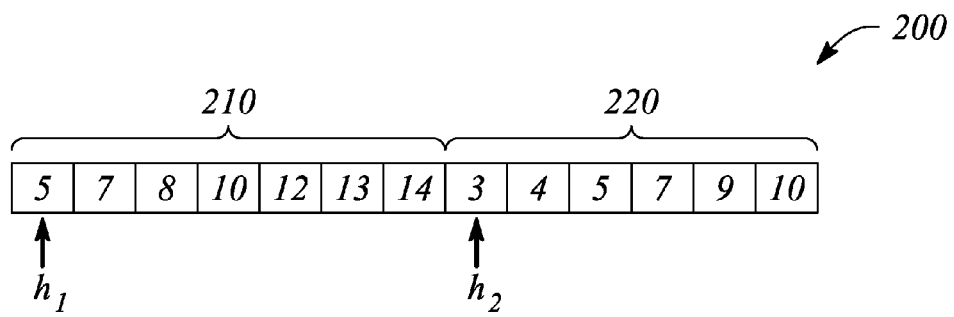
FIG. 4A illustrates a schematic diagram of an array of data, according to an example consistent with the principles described herein.

FIGS. 4A-4E illustrate merging a pair of subarrays 210, 220 of an array 200 of data, according to an example consistent with the principles described herein. In particular, FIG. 4A illustrates a schematic diagram of the array 200 of data. In some examples, the array 200 may be stored in the memory 110 of the shiftable memory 100, according to an example consistent with the principles described herein. As illustrated, the array 200 comprises a first subarray 210 of the pair adjacent to a second subarray 220 of the pair. Further as illustrated, the first and second subarrays 210, 220 are sorted arrays in which data in each of the subarrays 210, 220 is sorted in a non-decreasing order. The array 200 illustrated in FIG. 4A depicts the subarrays 210, 220 prior to application of the array-merging operator 120 of the shiftable memory 100 illustrated in FIG. 2

In some examples, the array 200 may represent an array A having data elements A[•] ranging from a first data element A[p] and a last data element A[r], for example. As illustrated in FIG. 4A, the first subarray 210 comprises data elements (e.g., A[p]=5 to A[q]=14) while the second subarray 220 comprises data elements (e.g., A[q+1]=3 to A[r]=10), where the index q is between index p and index r. Pointers $h_1$ and $h_2$ illustrated in FIG. 4A indicate the beginning or first data elements A[•] of the first subarray 210 and the second subarray 220, respectively. According to various examples, the illustrated configuration of FIG. 4A may correspond to the variables and discussion described above with respect to the example pseudocode. Further, the subarrays 210, 220 are each sorted arrays having data elements A[•] that are sorted in a non-decreasing order, as illustrated.

Figure 4B:
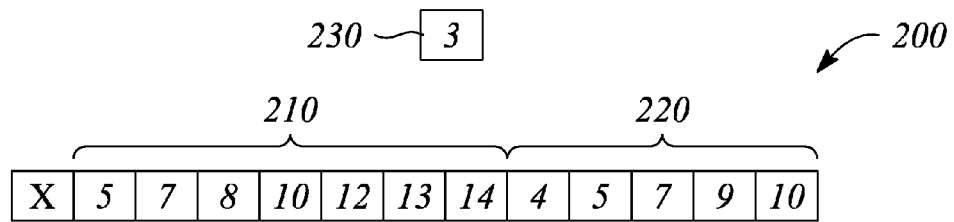
FIG. 4B illustrates a schematic diagram of the array of FIG. 4A after a right-shift of the data, according to an example consistent with the principles described herein.

FIG. 4B illustrates a schematic diagram of the array 200 of FIG. 4A after a right-shift of the data, according to an example consistent with the principles described herein. In particular, the right-shift has created or opened a space at a beginning of the first subarray 210 indicated by an 'X' in FIG. 4B, as illustrated. Further, FIG. 4B illustrates a first data element 'A[$h_2$]=3' of the second subarray 220 that has been copied out of the second subarray 220 prior to performing the right-shift. The copied first data element '3' may be temporarily stored in a memory register 230 (e.g., as the variable t), for example. According to various examples, the configuration illustrated in FIG. 4B may represent completion of the shiftr(•) function of the example pseudocode above.

Figure 4C:
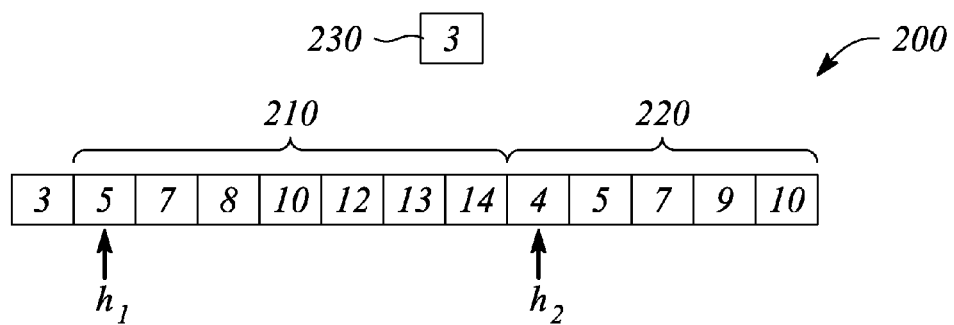
FIG. 4C illustrates a schematic diagram of the array of FIG. 4B following insertion of data, according to an example consistent with the principles described herein.

FIG. 4C illustrates a schematic diagram of the array 200 of FIG. 4B following insertion of data, according to an example consistent with the principles described herein. In particular, FIG. 4C illustrates the array 200 after the copied first data element '3' has been inserted into the shift-created open space at the beginning of the first subarray 210. FIG. 4C further illustrates the pointers $h_1$ and $h_2$ after the pointers $h_1$ and $h_2$ have been incremented.

The configuration of FIG. 4C may represent the array 200 at an end of the while . . . do loop (e.g., at the endwhile statement) of the above-referenced example pseudocode, for example. Note that since the pointers $h_1$ and $h_2$ have been incremented, the extents of the first subarray 210 and the second subarray 220 have changed, as illustrated. In particular, the beginning of the first and second subarrays 210, 220 are again indicated by the incremented pointers $h_1$ and $h_2$ in FIG. 4C. The illustrated configurations of FIGS. 4B and 4C may result when the comparing operator indicates that the first data element (e.g., $A[h_2]$=3) of the second subarray 220 should be inserted into the first subarray 210 (e.g., when $A[h_1] > A[h_2]$), for example.

Figure 4D:
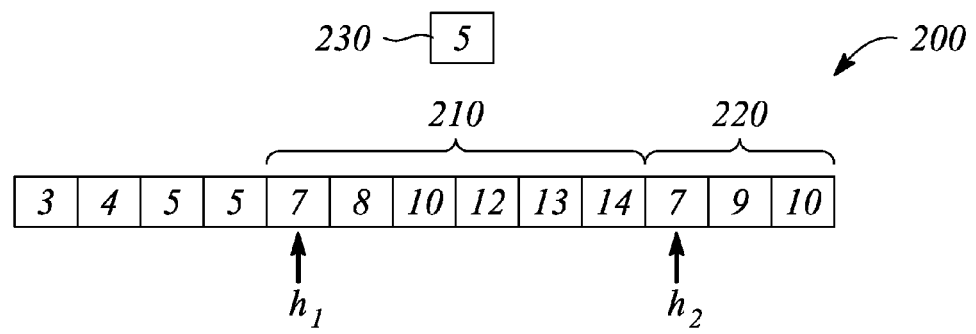
FIG. 4D illustrates a schematic diagram of the array of FIG. 4C after another right-shift and insertion of the data, according to an example consistent with the principles described herein.
Figure 4E:
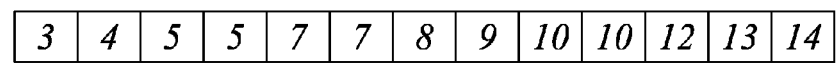
FIG. 4E illustrates a schematic diagram of the array of FIG. 4A following a complete merging of subarrays, according to an example consistent with the principles described herein.

FIG. 4D illustrates a schematic diagram of the array 200 of FIG. 4C after another right-shift and insertion of the data, according to an example consistent with the principles described herein. In particular, the configuration illustrated in FIG. 4D may result after several additional executions of the while . . . do loop ending again at the endwhile statement of the above-described pseudocode in a manner analogous to that illustrated in FIGS. 4B and 4C FIG. 4E illustrates a schematic diagram of the array 200 of FIG. 4A following a complete merging of the subarrays 210, 220, according to an example consistent with the principles described herein. In particular, the array 200 illustrated in FIG. 4E represents a completely merged array of the first subarray 210 with the second subarray 220 in a non-decreasing order by the array-merging operator 120. The completely merged array 200 illustrated in FIG. 4E may be the result of when the while . . . do loop of the example pseudocode terminates, for example.

Figure 5A:
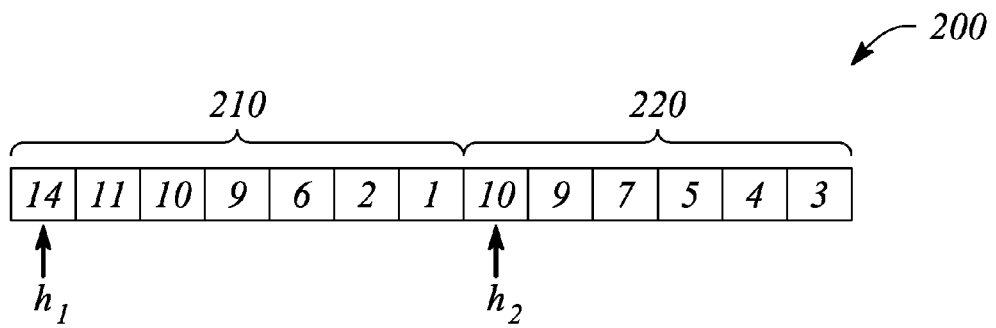
FIG. 5A illustrates a schematic diagram of another array of data prior to merging of subarrays, according to an example consistent with the principles described herein.

FIGS. 5A-5E illustrate merging another pair of subarrays 210, 220 of another array 200 of data, according to an example consistent with the principles described herein. In particular, FIG. 5A illustrates a schematic diagram of the array 200 of data stored in the memory 110 of the shiftable memory 100 prior to merging of the subarrays 210, 220 using the array-merging operator 120, according to an example consistent with the principles described herein. As illustrated, the subarrays 210, 220 are initially sorted in a non-increasing order.

Figure 5B:
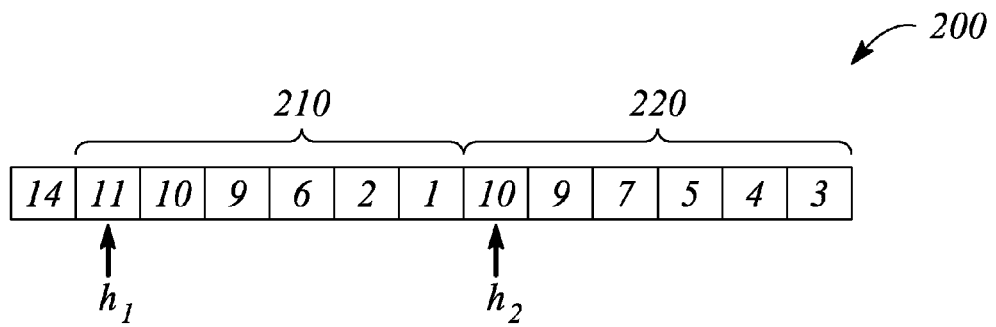
FIG. 5B illustrates a schematic diagram of the array of FIG. 5A after a first iteration of an array-merging operator, according to an example consistent with the principles described herein.

FIG. 5B illustrates a schematic diagram of the array 200 of FIG. 5A after a first iteration of the array-merging operator 120, according to an example consistent with the principles described herein. For example, the configuration illustrated in FIG. 5B may be the array 200 after a first execution of the while . . . do loop in the above-referenced example pseudocode starting with the array 200 of data of FIG. 5A. In particular, the compare operator of the if . . . then statement is a 'less than' operator (e.g., '<') since the subarrays 210, 220 are sorted in a non-increasing order, in this example. Given that the first data element A[$h_1$] (i.e., 14) of the first subarray 210 is not less than the first data element A[$h_2$] (i.e., 10) of the second subarray 220 (i.e., A[$h_1$]<A[$h_2$] is 'False'), no right-shift has been performed. Instead, the first pointer $h_1$ has been incremented while the second pointer $h_2$ has not been incremented, as illustrated in this example.

Figure 5C:
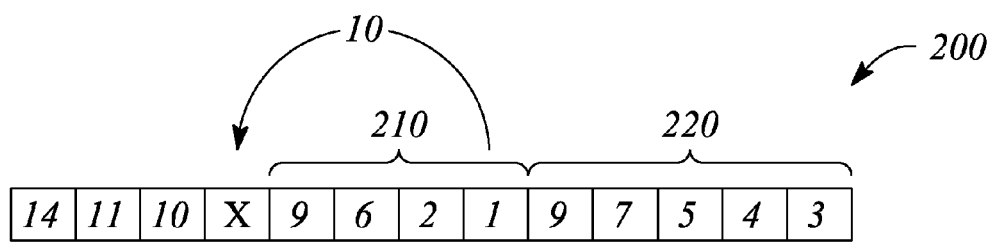
FIG. 5C illustrates a schematic diagram of the array after a right-shift of the data to open a space at a beginning of a first subarray, according to an example consistent with the principles described herein.

FIG. 5C illustrates a schematic diagram of the array 200 after a right-shift of the data to open a space at a beginning of the first subarray 210, according to an example consistent with the principles described herein. The opened space is indicated by an 'X' in FIG. 5C and a data element 'A[$h_2$]=10' of the second subarray 220 adjacent to the first subarray 210 has been copied out of the second subarray 220 prior to the right-shift of the data, as illustrated. FIG. 5C may represent the array 200 of data illustrated in FIG. 5A after several loops of the example pseudocode function MERGE(•) described above, for example. In particular, prior to the shift, a comparison of a first data element A[$h_1$]=9 in the first subarray 210 with a first data element A[$h_2$]=10 in the second subarray 220 indicated that shift should take place. For example, the data element A[$h_1$]=9 is less than the data element A[$h_2$]=10 when compared just prior to the right-shift. The shift was then performed to yield the configuration of FIG. 5C. According to various examples, the configuration illustrated in FIG. 5C may represent completion of the shiftr(•) function of the example pseudocode above where the compare operator is the 'less than' operator (i.e., '<'), for example.

Figure 5D:
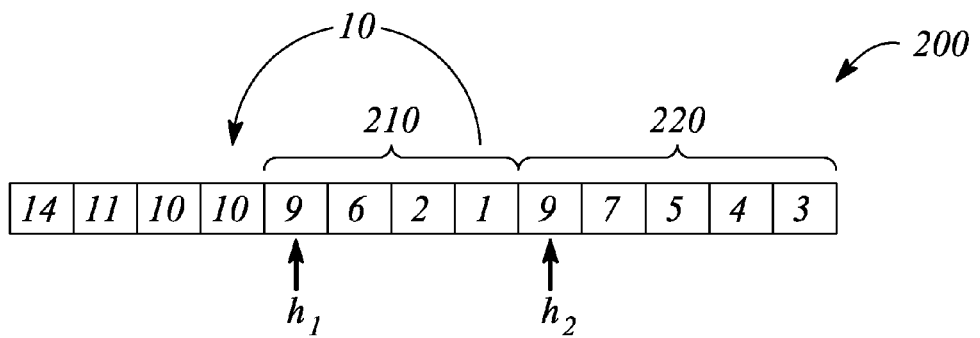
FIG. 5D illustrates a schematic diagram of the array of FIG. 5C following insertion of data, according to an example consistent with the principles described herein.

FIG. 5D illustrates a schematic diagram of the array 200 of FIG. 5C following insertion of data, according to an example consistent with the principles described herein. In particular, FIG. 5D illustrates the array 200 after the copied data element '10' has been inserted into the open space at the beginning of the first subarray 210 and the pointers $h_1$ and $h_2$ have been incremented. The array 200 of FIG. 5D may represent the array 200 at an end of the while . . . do loop (e.g., at the endwhile statement) of the above-referenced example pseudocode, for example. Further, copying and inserting of the second array data element A[$h_2$]=10 may be provided by a rotational shift as illustrated by the curved arrow in FIGS. 5C and 5D, according to some examples.

Figure 5E:
FIG. 5E illustrates a schematic diagram of the array of FIG. 5A following a complete merging of subarrays, according to an example consistent with the principles described herein.

FIG. 5E illustrates a schematic diagram of the array 200 of FIG. 5A following a complete merging of the subarrays 210, 220, according to an example consistent with the principles described herein. In particular, the array 200 illustrated in FIG. 5E represents a completely merged array of the first subarray 210 with the second subarray 220 in a non-increasing order by the array-merging operator 120. The completely merged array 200 illustrated in FIG. 5E may be the result of when the while . . . do loop of the example pseudocode function MERGE(•) terminates, for example.

Figure 6:
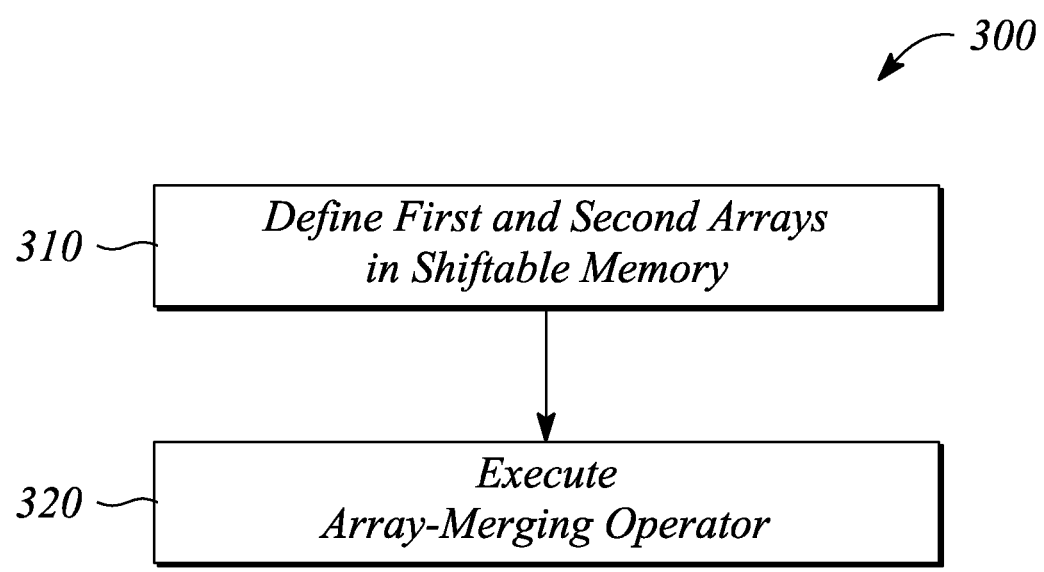
FIG. 6 illustrates a flow chart of a method of merging arrays of data using shiftable memory, according to an example consistent with the principles described herein.

FIG. 6 illustrates a flow chart of a method 300 of merging arrays of data using shiftable memory, according to an example consistent with the principles described herein. The method 300 comprises defining 310 a first array and a second array in the shiftable memory. The shiftable memory provides built-in shifting capability to shift a contiguous subset of the data from a first location to a second location within the shiftable memory. A size of the contiguous subset of data is less than a total size of the shiftable memory. According to various examples, the contiguous subset of data comprises the first array. In some examples, the shiftable memory may be substantially similar to the shiftable memory 100, described above. In particular, the first and second arrays may be defined 310 in the memory 110 of the shiftable memory 100, according to some examples.

The method 300 of merging arrays of data further comprises executing 320 an array-merging operator. The array-merging operator is configured to merge the first array and the second array to produce a merged array. The merged array is produced during the execution 320 of the array-merging operator by shifting the contiguous subset of data using the built-in shifting capability of the shiftable memory. In some examples, the array-merging operator that is executed 320 may be substantially similar to the array-merging operator 120 described above with respect to the shiftable memory 100.

In some examples, executing 320 the array-merging operator comprises comparing a data element in the second array with a data element of the first array. In some examples, the first and second arrays comprise data elements having assigned values that respectively are sorted. For example, the first and second arrays may be sorted in either a non-decreasing order or a non-increasing order with respect to the assigned values of the data elements in the arrays. If the first and second arrays are sorted in a non-decreasing order, comparing data elements in the first and second arrays may indicate that the second array data element should be inserted when the first array data element has a value that is greater than the second array data element, for example. In other examples, comparing data elements in the first and second arrays may indicate that the second array data element should be inserted when the first array data element has a value that is less than the second array data element if the data elements of the first and second arrays are sorted in a non-increasing order, for example.

In some examples, executing 320 the array-merging operator further comprises shifting the data of first array to open a space at a first end of the first array using the built-in shifting capability of the shiftable memory. In some examples, shifting is performed when comparing data elements indicates that the second array data element is to be inserted at the first end of the first array. Shifting the data elements of the first array may comprise the shiftable memory performing a right-shift of the contiguous subset of data, for example. The right-shift may move the contiguous subset of data by a distance within the shiftable memory corresponding to one data element, according to some examples. In some examples, the shifting of data overwrites a data element of the second array (e.g., a first data element of the second array). In some examples, the data element of the second array that is overwritten by the shifting may be copied to a temporary register prior to being overwritten. In other examples, the shifting of data is provided by a rotational shift that automatically transfers the data element to a beginning of the contiguous subset of data.

In some examples, executing 320 the array-merging operator further comprises inserting the data element of the second array into the open space at the first end of the first array. For example, the copy of the data element of the second array that was stored in a temporary register may be copied into the open space to provide the insertion. In another example, the insertion is performed as part of the shifting. For example, when a rotational shift is performed, the second array data element may be automatically transferred to and thus inserted at the first end of the first array (e.g., when the first end of the first array corresponds to the beginning of the contiguous subset of data).

In some examples, the first array and the second array are arranged adjacent to one another in the shiftable memory. In other examples, the first array and the second array are not adjacent to one another. When adjacent, executing 320 the array-merging operator may provide an in-place merge to replace the first and second arrays with the merged array. In some examples, such as when the first and second arrays are sorted arrays, the in-place merge replaces the first and second arrays with the merged array comprising data from the first and second arrays arranged in the sorted order. In examples in which the first and second arrays are not adjacent to one another, executing 320 the array-merging operator may replace the first array with the merged array, albeit as a generally larger array than the first array, for example.

Thus, there have been described examples of a shiftable memory supporting array merging, an array-merging system and a method of merging arrays of data using shiftable memory. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A shiftable memory supporting array merging comprising:
a memory to store data, the memory providing built-in shifting capability to shift a contiguous subset of the data from a first location to a second location within the memory, the built-in shifting capability to shift only data of the contiguous subset having a size that is smaller than a total size of the memory; and
an array-merging operator to produce a merged array using the built-in shifting capability of the memory, the merged array representing the merging of a first array of data and a second array of data, the contiguous subset of the data comprising the first array.

2. The shiftable memory of claim 1, wherein each of the first array, the second array and the merged array are sorted arrays.

3. The shiftable memory of claim 2, wherein data in the sorted arrays are assigned values that are sorted in a non-decreasing order.

4. The shiftable memory of claim 1, wherein the first array and the second array are subarrays that are located adjacent to one another and collocated with the merged array in the memory, the merged array being produced in place in the memory to replace the adjacent first and second subarrays.

5. The shiftable memory of claim 4, further comprising a temporary memory register to hold data from the second subarray while the memory shifts the contiguous subset of data of the first subarray to open a space for insertion of the data held by the temporary register.

6. The shiftable memory of claim 1, wherein the array-merging operator is to perform operations comprising:
comparing a data element in the first array with a corresponding data element of the second array;
shifting the data of the first array to open a space at a first end of the first array using the built-in shifting capability of the memory, shifting the data being performed when comparing the data elements indicates that the corresponding data element of the second array is to be inserted into the first end of the first array; and
inserting the corresponding data element of the second array into the open space at the first end of the first array.

7. The shiftable memory of claim 1, wherein the built-in data shifting capability implements a rotational shift of the contiguous subset of data.

8. The shiftable memory of claim 1, further comprising a controller to select the contiguous subset of data and to implement the shift under direction of the array-merging operator.

9. An array-merging system comprising:
an array-merging operator using a built-in shifting capability of a shiftable memory to merge a first array of data and a second array of data to produce a merged array of data stored in the shiftable memory; and
a controller to select a contiguous subset of data in the shiftable memory, the contiguous subset of the data comprising the first array, the controller further to implement a shift of the contiguous subset of data under direction of the array-merging operator,
wherein the shiftable memory comprises a plurality of memory cells to hold data elements, the shiftable memory to shift the contiguous subset of data stored in the memory cells within the shiftable memory, the contiguous subset of data having a size that is smaller than a total size of the shiftable memory.

10. The array-merging system of claim 9, wherein the first array and the second array are each sorted subarrays that are located adjacent to one another in the shiftable memory, the merged array to replace the sorted subarrays in the shiftable memory when the merged array is produced by the array-merging operator.

11. The array-merging system of claim 9, wherein the array-merging operator is stored in non-transient computer readable media, and wherein the controller comprises a computer processor that reads the computer readable media and executes the array-merging operator.

12. A method of merging arrays of data using shiftable memory, the method comprising:
defining a first array and a second array in the shiftable memory, the shiftable memory providing built-in shifting capability to shift a contiguous subset of data from a first location to a second location within the shiftable memory, a size of the contiguous subset of data being less than a total size of the shiftable memory, the contiguous subset of data comprising the first array; and
executing an array-merging operator to merge the first array and the second array to produce a merged array by shifting the contiguous subset of data using the built-in shifting capability of the shiftable memory.

13. The method of merging arrays of claim 12, wherein executing the array-merging operator comprises:
comparing a data element in the second array with a data element of the first array;
shifting the data of first array to open a space at a first end of the first array using the built-in shifting capability of the shiftable memory, wherein shifting the data is performed when comparing the data elements indicates that the second array data element is to be inserted to the first end of the first array; and
inserting the data element of the second array into the open space at the first end of the first array.

14. The method of merging arrays of claim 13, wherein the first array and the second array each comprises data elements having assigned values that are respectively sorted in either a non-decreasing order or a non-increasing order, and wherein when the first and second arrays are respectively sorted in the non-decreasing order, comparing the data elements indicates that the second array data element is to be inserted in the open space when the first array data element has a value that is greater than the second array data element, and wherein when the first and second arrays are respectively sorted in the non-increasing order, comparing the data elements indicates that the second array data element is to be inserted when the first array data element has a value that is less than the second array data element.

15. The method of merging arrays of claim 12, wherein the first array and the second array are arranged adjacent to one another in the shiftable memory, and wherein executing the array-merging operator provides an in-place merge to replace the first and second arrays with the merged array comprising data from the first and second arrays arranged in a sorted order.

* * * * *